(12) United States Patent
Macerola et al.

(10) Patent No.: US 7,978,556 B2
(45) Date of Patent: *Jul. 12, 2011

(54) ON-CHIP TEMPERATURE SENSOR

(75) Inventors: Agostino Macerola, San Benedetto dei Marsi (IT); Giulio-Giuseppe Marotta, Contigliano (IT); Marco-Domenico Tiburzi, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/613,139

(22) Filed: Nov. 5, 2009

(65) Prior Publication Data

US 2010/0046311 A1 Feb. 25, 2010

Related U.S. Application Data

(63) Continuation of application No. 11/891,949, filed on Aug. 14, 2007, now Pat. No. 7,630,265.

(30) Foreign Application Priority Data

Dec. 14, 2006 (IT) ............................. RM2006A0675

(51) Int. Cl.
*G11C 7/04* (2006.01)
(52) U.S. Cl. .................... 365/211; 365/210.12; 365/212

(58) Field of Classification Search .................. 365/211, 365/212, 210.1, 210.12
See application file for complete search history.

(56) References Cited

U.S. PATENT DOCUMENTS

| 6,954,394 | B2 | 10/2005 | Knall et al. |
| 7,033,072 | B2 | 4/2006 | Aota et al. |
| 7,177,218 | B2 | 2/2007 | Choi et al. |
| 7,362,248 | B2 | 4/2008 | McClure et al. |
| 7,495,467 | B2 | 2/2009 | Lin et al. |
| 7,630,265 | B2 * | 12/2009 | Macerola et al. ............. 365/211 |
| 2008/0137460 | A1 | 6/2008 | Incarnati et al. |

* cited by examiner

*Primary Examiner* — VanThu Nguyen
*Assistant Examiner* — Hien N Nguyen
(74) *Attorney, Agent, or Firm* — Leffert Jay & Polglaze, P.A.

(57) ABSTRACT

A temperature invariant reference voltage and a temperature variant physical quantity, such as a voltage or current, are generated. The temperature variant physical quantity changes in response to a temperature of the integrated circuit. A temperature sensor circuit generates a voltage that is linearly dependent on the temperature. A level generator circuit generates $2^n-1$ voltage levels from the reference voltage. A comparator circuit, such as an analog-to-digital circuit, compares the voltage from the temperature sensor to the $2^n-1$ voltage levels to determine which level is closest. An n-bit digital output of the resulting level is proportional to the temperature of the integrated circuit.

20 Claims, 8 Drawing Sheets

| n-BIT | TEMP. RANGE (K) |
|---|---|
| 00 | <240 |
| 01 | 240-300 |
| 10 | 300-360 |
| 11 | >360 |

FIG. 10A

| n-BIT | TEMP. RANGE (K) |
|---|---|
| 000 | <240 |
| 001 | 240-260 |
| 010 | 260-280 |
| 011 | 280-300 |
| 100 | 300-320 |
| 101 | 320-340 |
| 110 | 340-360 |
| 111 | >360 |

FIG. 10B

ON-CHIP TEMPERATURE SENSOR

RELATED APPLICATIONS

This application is a Continuation of U.S. application Ser. No. 11/891,949, titled "ON-CHIP TEMPERATURE SENSOR" filed Aug. 14, 2007, now U.S. Pat. No. 7,630,265 (Allowed) that claims priority to Italian Patent Application Serial No. RM2006A000675, filed Dec. 14, 2006, entitled "ON-CHIP TEMPERATURE SENSOR," all of which are commonly assigned and incorporated herein by reference.

TECHNICAL FIELD OF THE INVENTION

Embodiments of the present invention relate generally to temperature sensing and more particularly to temperature sensing in an integrated circuit.

BACKGROUND OF THE INVENTION

It is sometimes desirable to know the internal temperature of integrated circuits. The integrated circuit temperature can be used to improve circuit operation by compensating signals that change from nominal operation when the chip temperature changes.

For example, in a non-volatile memory device such as a NAND flash memory, programming and reading memory cell data requires various voltages for programming the cell to a desired threshold voltage and then applying that threshold voltage to the cell to determine if the cell turns on and conducts. If the cell does not turn on, it has not been programmed to the desired threshold.

During operation of the integrated circuit, the temperature varies both due to ambient temperature, as well as to the electrical operation of the integrated circuit, causing a temperature increase. The temperature change can cause a change in the operating characteristics of the memory cell. For example, a threshold voltage of 1V at room temperature may turn into a threshold voltage of 900 mV as the chip temperature increases. The change in voltage levels can have an impact on reading, programming, and verifying operations that are expecting a certain voltage.

Temperature change in a dynamic random access memory (DRAM) device can also have an impact on memory operation. A DRAM requires periodic refresh cycles in order to maintain the integrity of the data stored in the memory. The temperature of the memory device affects the frequency at which the memory device needs to be refreshed. As the device heats up, the cells lose their ability to hold a charge due to current leakage. Therefore, the warmer the device the more often it has to be refreshed.

Designers typically take into account the worst case requirement for refreshing a DRAM and design the memory to refresh at a fixed rate consistent with the maximum operating temperature of the part. However, the faster refresh rate is not required when the device is operating at a cooler temperature, thus wasting power. It would therefore be beneficial to be able to determine the memory device's internal temperature in order to adjust the refresh rate in response to changing temperature.

For the reasons stated above, and for other reasons stated below which will become apparent to those skilled in the art upon reading and understanding the present specification, there is a need in the art for temperature sensing in an integrated circuit.

DETAILED DESCRIPTION

In the following detailed description, reference is made to the accompanying drawings that form a part hereof, and in which is shown, by way of illustration, specific embodiments. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the embodiments is defined only by the appended claims and equivalents thereof.

Figure 1:
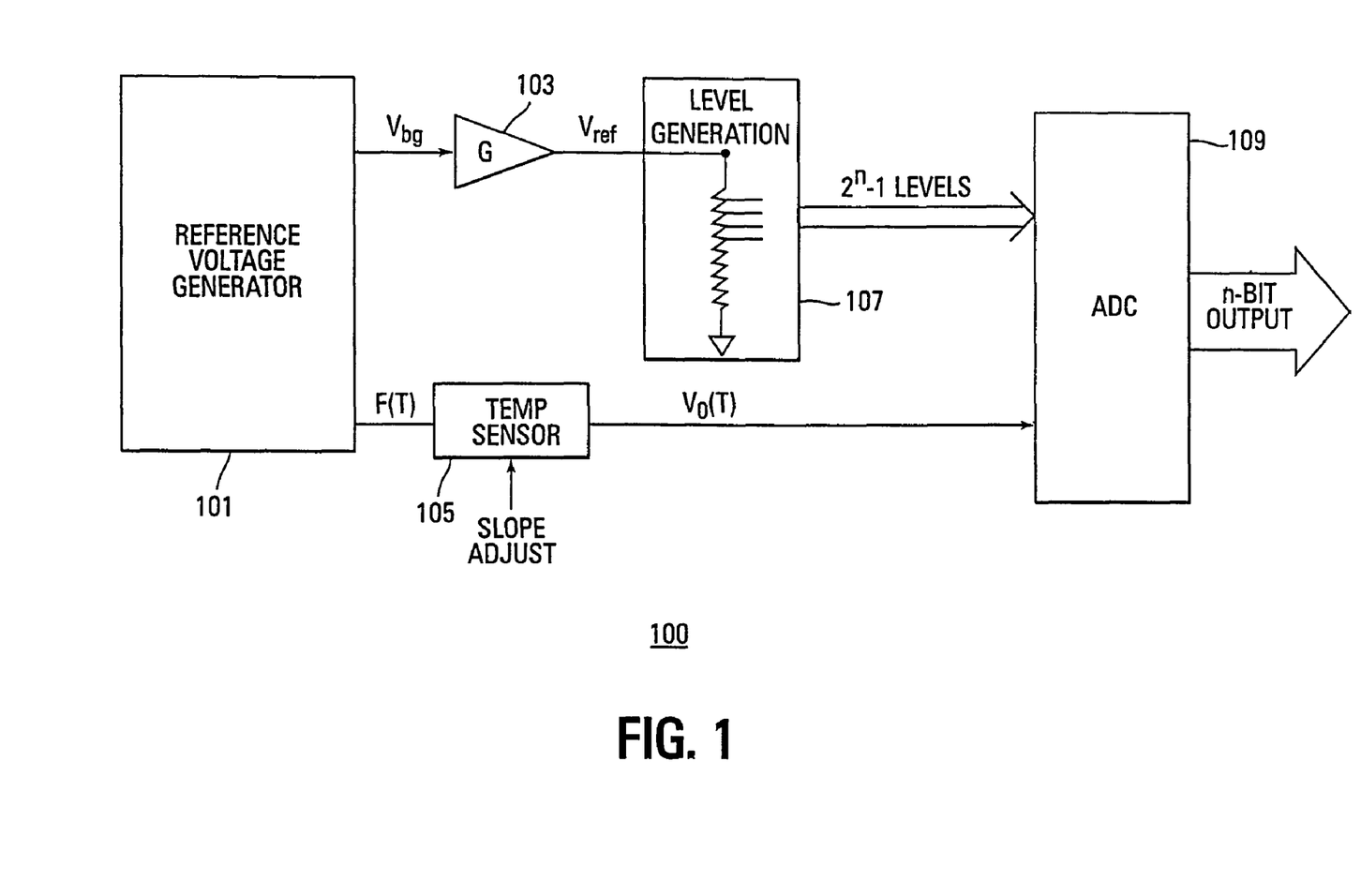
FIG. 1 shows a block diagram of one embodiment of a temperature sensing circuit.

FIG. 1 illustrates a block diagram of one embodiment of a temperature sensing circuit 100. The circuit is comprised of a reference voltage generator circuit 101 that outputs a temperature invariant voltage $V_{bg}$ and a temperature variant value F(T). The temperature variant value F(T) is a physical quantity (e.g., a voltage or a current) having a linear temperature coefficient.

Figure 2:
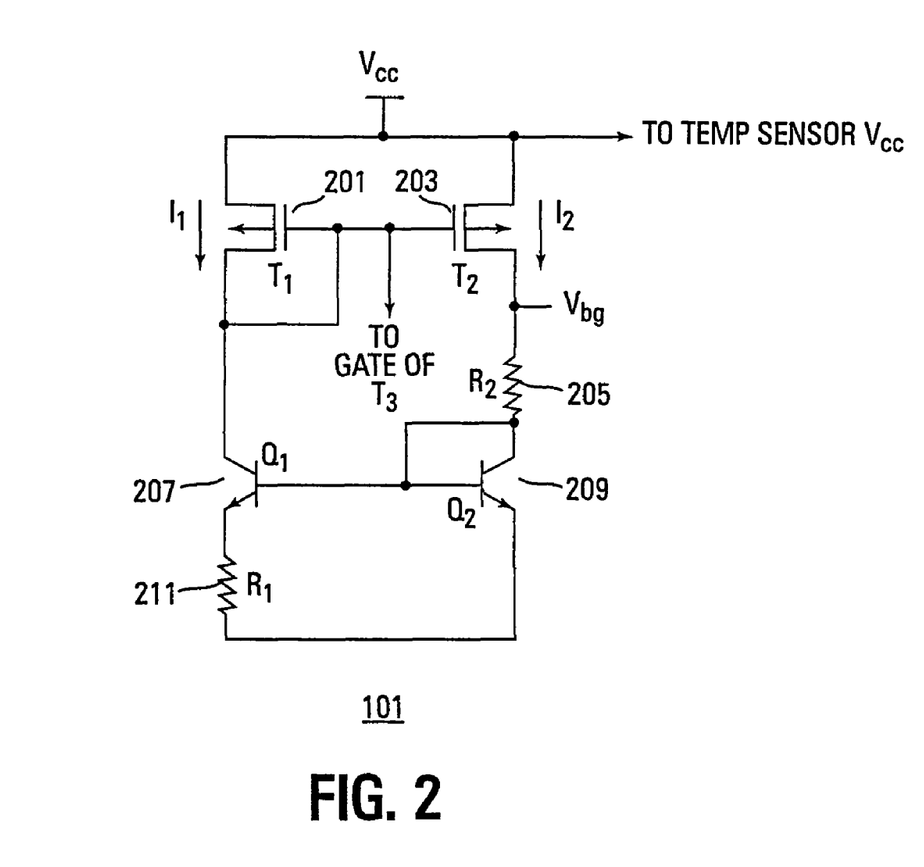
FIG. 2 shows a schematic diagram of one embodiment for a band-gap voltage reference circuit.

In one embodiment, the reference voltage generator circuit 101 is a band-gap voltage reference circuit. FIG. 2 illustrates one such band-gap voltage reference circuit that is described subsequently in greater detail.

The temperature independent voltage $V_{bg}$ is input to an amplifier 103 that outputs a reference voltage $V_{ref}$ that is optimized for other parts of the circuit 100. In one embodiment, $V_{bg}$ is in the range of 1.12V to 1.25V and the amplifier 103 provides a gain factor, G, of 1.12 to output a $V_{ref}$ voltage of 1.4V. Alternate embodiments can use other voltages.

The amplifier 103 also provides a buffer function between the reference voltage generator circuit 101 and the level generator circuit 107. The amplifier 103 electrically isolates the circuitry of the band-gap reference circuit 101 from the level generation circuit 107.

The level generation circuit 107 divides the temperature invariant $V_{ref}$ voltage from the amplifier 103 (e.g., 1.4V) into $2^n-1$ voltage levels through taps on a series of resistors. One embodiment of the level generation circuit 107 is illustrated in greater detail in FIG. 4 and is described subsequently.

A temperature sensor circuit 105 is coupled to the physical quantity F(T) that is output from the reference voltage generator. One embodiment of a temperature sensor 105 is illustrated in greater detail in FIG. 3 and described subsequently.

The temperature sensor 105 generates a voltage, $V_0(T)$, that is linearly dependent on the temperature starting from the physical quantity F(T). This voltage at 0 Kelvin is 0V while the slope of $V_0(T)$ is determined by a digital control referred to in FIG. 1 as slope adjust.

The slope adjust input is a digital correction factor that is determined during testing and calibration phase of the integrated circuit manufacturing process. The slope adjust corrects each individual die for the variations that occur between dies during manufacturing so that all of the dies have a uniform operation.

The slope adjust is determined by inputting a known physical quantity F(T) to the temperature sensor 105 at a certain operating temperature. A known $V_0(T)$ is expected at the output. If the expected $V_0(T)$ is not output by the sensor, the required slope adjust is determined that would generate the desired $V_0(T)$ level. The slope adjust is input to the temperature sensor 105 and stored in memory in the integrated circuit for future use.

An analog-to-digital converter (ADC) 109, or other comparison circuit, compares the $V_0(T)$ signal with the $2^n-1$ voltage levels and generates an n-bit digital output that is proportional to the actual temperature. The ADC 109 determines to which of the $2^n-1$ levels $V_0(T)$ is closest.

The ADC 109 can be a comparison circuit that is comprised of one of many different architectures. One embodiment is a flash ADC comprising $2^n-1$ comparators with outputs coupled to a decoder that provides the binary output. Another embodiment can be a linear ramp ADC that uses a comparator coupled to an n-bit counter that provides the output. Still another ADC includes a successive approximation ADC that uses a comparator coupled to an n-bit successive approximation register.

Figure 6:
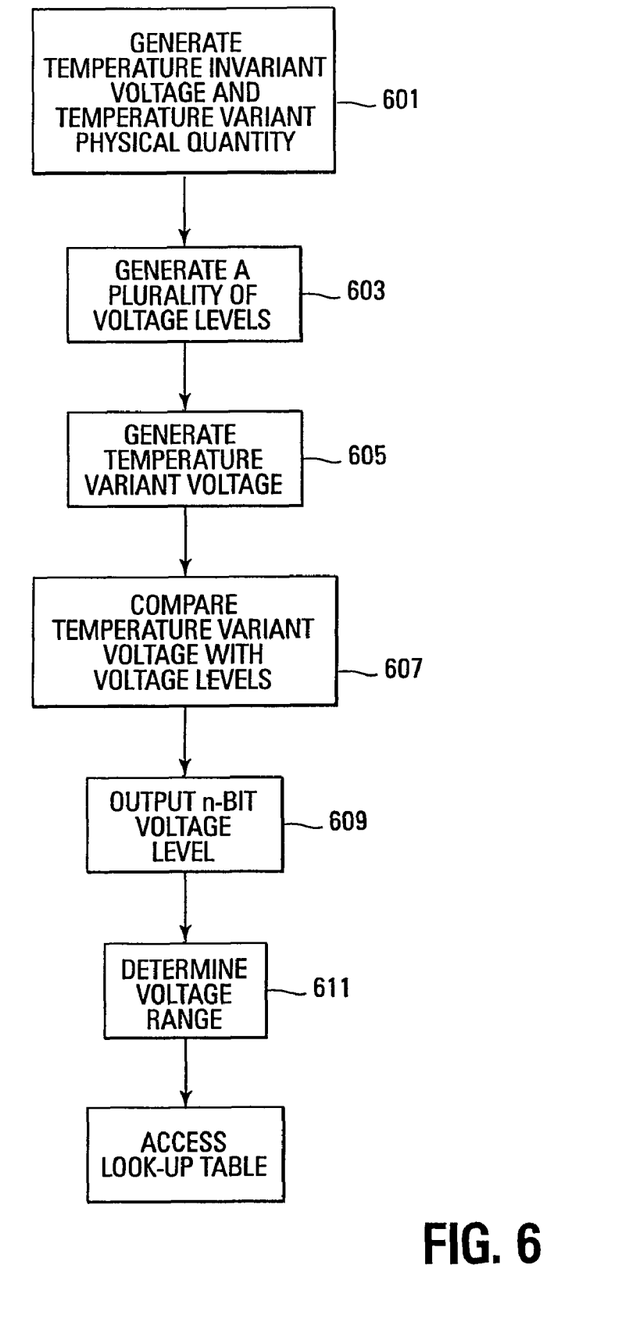
FIG. 6 shows a flowchart of one embodiment of a method for measuring the temperature of an integrated circuit in accordance with the embodiment of FIG. 1.

As an example of operation of the temperature sensing circuit 100 of FIG. 1, FIG. 6 illustrates a flowchart of one embodiment of a method for measuring the temperature of an integrated circuit. The method begins by generating the temperature invariant voltage, $V_{bg}$, and the temperature variant physical quantity, F(T), in response to the temperature of the integrated circuit 601.

The amplifier provides a gain factor to $V_{bg}$ to increase the approximately 1.12-1.25V output from the reference voltage generator to 1.4V. This is input to the level generator circuit that generates a plurality of levels 603 in response to the temperature invariant voltage. The temperature sensor circuit generates a temperature variant voltage $V_0(T)$ in response to F(T) 605.

The ADC compares the temperature variant voltage to the $2^n-1$ voltage levels to determine which level is closest 607. For example, if $V_0(T)$ is closes to the third level, n=2 is output from the ADC 109 since $2^2-1=3$ (third level). The ADC then outputs the n-bit voltage level 609 in response to this comparison. An integrated circuit controller circuit reads this n-bit value and determines the temperature or temperature range of the integrated circuit 611 from a look-up table stored in memory. The greater the quantity of bits generated by the ADC, the greater the granularity possible in determining the integrated circuit temperature.

FIG. 2 illustrates one embodiment of a reference voltage generator circuit 101. This circuit 101 is a band-gap voltage reference circuit. The temperature invariant voltage, $V_{bg}$, is obtained by adding two voltages in the circuit: the base-emitter voltage ($V_{be}$) across the PMOS transistor 203 and the voltage drop across the resistor 205 that is coupled to the $V_{bg}$ output.

The bipolar transistors 207, 209 have area N and 1 respectively, where N>1. Area N is conventionally obtained by multiple placements of transistors of area 1. Increasing N has the effect of modifying the current amplification.

The PMOS transistors 201, 203 are equal in size and symmetrical in layout. Since the PMOS transistors 201, 203 are arranged in a current mirror configuration, the currents $I_1$ and $I_2$ are substantially equal. From basic silicon junction diode equations, the forward current $I_b$ of the base-emitter diode of a bipolar transistor 207, 209 is $I_{b2}=I_0 e^{V_{be}/V_t}$ where $I_0$ is the diode saturation current, proportional to the base-emitter area; $V_{be}$ is the base-emitter voltage; and $V_t$ is kT/q (k=Boltzmann constant; T=absolute temperature; q=electron charge).

Since the base-emitter area of the bipolar transistor 207 is N times greater than the base-emitter area of the other bipolar transistor 209, $I_{b1}=NI_0 e^{(V_{be}-V_e)/V_t}$. The collector currents, $I_{c1}$ and $I_{c2}$, are: $I_{c1}=\beta_1 I_{b1}$ and $I_{c2}=\beta_2 I_{b2}$; where $\beta_1$ and $\beta_2$ are the current gains ($h_{FE}$) of the bipolar transistors 207, 209.

From Kirchoff's first law as applied to the collector node of the bipolar transistor 209, $I_2=I_{c2}+I_{b1}+I_{b2}$. Assuming $\beta_1$ and $\beta_2$ being large, $I_{b1}$ and $I_{b2}$ can be ignored in an approximation. Therefore, $I_{c2}=I_2$ and $I_{c1}=I_1$ and $I_{c2}=I_{c1}$.

Considering if $\beta_1=\beta_2$, $I_{b2}=I_{b1}$ is obtained. Thus, from the above equations, it can be seen that: $NI_0 e^{(V_{be}-V_e)/V_t}=I_0 e^{V_{be}/V_t}$. From simple calculations, this becomes $V_e=V_t \ln(N)=kT \ln(N)/q$. The voltage $V_e$ is typically referred to as $\Delta V_{be}$ and has the same expression as most band-gap reference architectures. By construction, $V_{bg}=V_{be}+R_2 I_2$ and $I_1=V_e/R_1$. Therefore, $I_2=V_e/R_1$. From these equations it can be seen that $V_{bg}=V_{be}+R_2 kT \ln(N)/R_1 q$.

It is well known in the art that $\partial V_{be}/\partial T$ is approximately −2 mV/° C. It is possible to have $\partial V_{bg}/\partial T=0$. By proper selection of resistor $R_2$ 205, N, and resistor $R_1$ 211: $-\partial V_{be}/\partial T=(R_2/R_1)k \ln(N)/q$. The second term in this equation is the slope of the voltage across resistor $R_2$ 205 versus temperature T. Another way to write the second term of this equation is $(R_2/R_1)\Delta V_{be}$. The quantity $I_1=I_{ptat}$ is proportional to absolute temperature. With respect to FIG. 1, it is possible to write F(T) as:

$$F(T) = I_{ptat} = \frac{k}{q} * \frac{1}{R_1} * \ln(N) * T = Hi * T$$

The band-gap reference circuit 101 of FIG. 2 is for purposes of illustration only. Alternate embodiments such as a Brokaw-cell band-gap reference circuit or other types of reference voltage generator circuits may also be used.

Figure 3:
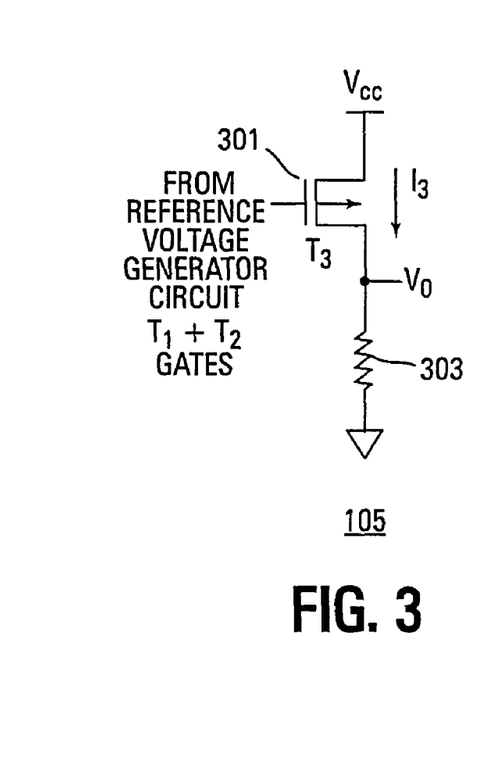
FIG. 3 shows a schematic diagram of one embodiment for a temperature sensor circuit.

FIG. 3 illustrates one embodiment of a temperature sensor circuit 105 as used in FIG. 1. This circuit 105 is comprised of a PMOS transistor 301 connected to a resistor 303. The source of the transistor 301 is connected to the supply voltage $V_{CC}$ node of FIG. 2 and the node between the transistor's drain and the resistor 303 is the output voltage $V_0(T)$. The gate of transistor T3 301 is connected to the same terminal as the gates of transistors T1 201 and T2 203 of the reference voltage generator circuit of FIG. 2.

In operation, the current through the transistor 301 mirrors the current through the T1 201 and T2 203 transistors of FIG. 2. When substantially the same lengths for the MOS devices 201, 203, and 301 are chosen, the current mirrors are used to multiply the current by a given factor. However, these transistors 201, 203, 301 have different widths so that the ratio of the current that flows through two of these transistors is equal to the width ratio. In other words, the ratio between the current that flows through transistor T3 301 and the current that flows through transistor T2 203 is fixed by their geometry and is subsequently referred to as Hm.

The temperature sensor 105 of FIG. 3 is used when the physical quantity F(T) output from the reference voltage generator circuit is a current-based quantity. The variation of $(R_2/R_1)\Delta V_{be}$ in the band-gap circuit of FIG. 2 is assigned according to the equation $-\partial V_{be}/\partial T=(R_2/R_1)k\ln(N)/q$. Its absolute value can be amplified to adapt it to drive the circuit of FIG. 3.

In the combination of the temperature sensor circuit 105 of FIG. 3 and the band-gap circuit of FIG. 2, $V_0=R_3*I_3$ where $I_3=Hm*I_{ptat}$ (Hm: mirror ratio $M_3/M_2$). Thus, $V_0=Hm*Hi*T=G*T$ where $Hi=(k/q)*\ln(N)/R_1$ and G is a constant that nominally depends only by three geometric ratios: N, Hm, and $R_3/R_1$.

By adjusting the resistance of $R_3$, it is possible to change the slope of $V_0(T)$. Thus, one embodiment for operation of the slope adjust of FIG. 1 as described previously is to set the value of the resistance of $R_3$ depending on the desired slope for nominal operation.

In another embodiment, F(T) is a temperature dependent voltage. In this case, the temperature sensor can use another programmable gain buffer (i.e., gain block G 103 in FIG. 1) to provide the output voltage $V_0(T)$.

Figure 4:
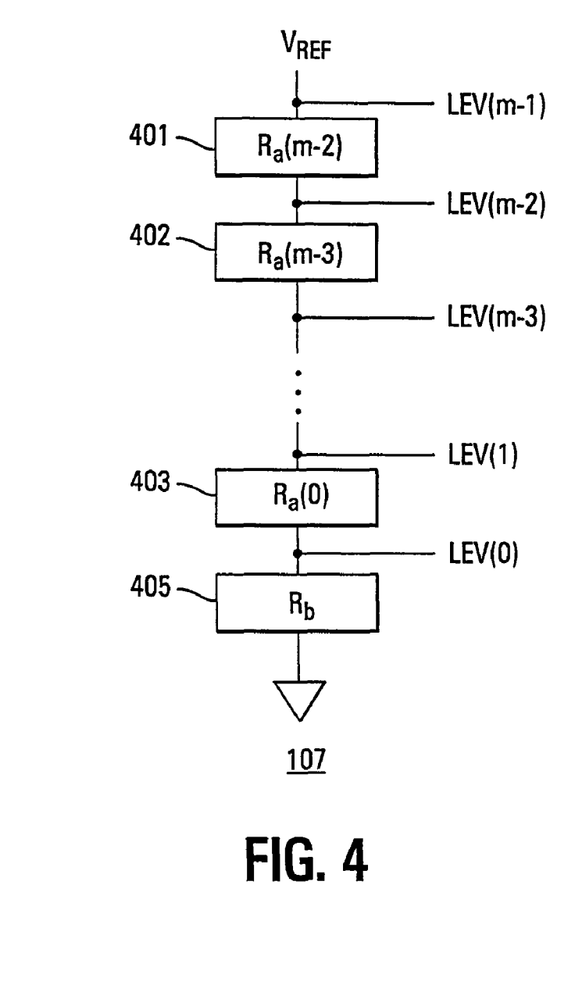
FIG. 4 shows a block diagram of one embodiment of a reference level generation circuit.

FIG. 4 illustrates one embodiment of a level generation circuit 107. The reference voltage $V_{ref}$ is divided down into $2^n-1$ levels by a plurality of resistors 401-403, where $m=2^n$, connected as a resistor divider circuit. By assigning the gain G, from the amplifier 103 of FIG. 1, and/or the slope of $V_0(T)$, it ensures that $V_{ref}=V_0(T_{max})$. Using the series of resistors 401-403 with a nominal value of $R_a$ and one resistor with a nominal value of $R_b$, the voltage levels generated are $$lev(k) = \frac{R_b + kR}{R_b + (2^n - 2)R_a} \cdot V_{ref}$$

The knowledge of the highest level $lev(2^n-1)=V_{ref}$ and the lowest $lev(0)=V_0(T_{max})$, allows the ratio between $R_a$ and $R_b$ to be calculated.

Figure 5:
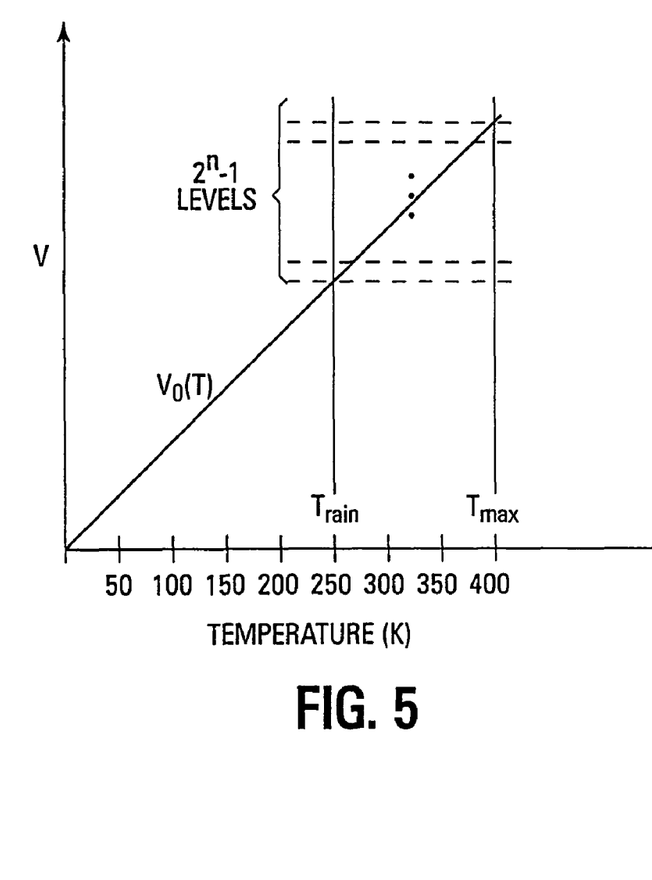
FIG. 5 shows a graphical representation of an equation for $V_0(T)$ on a voltage versus temperature graph in accordance with the present embodiments.
Figure 10A:
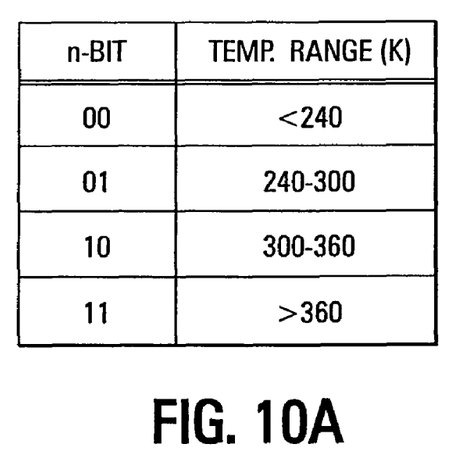
FIGS. 10A and 10B show tables of n-bit words and their respective temperature ranges in Kelvin.
Figure 10B:
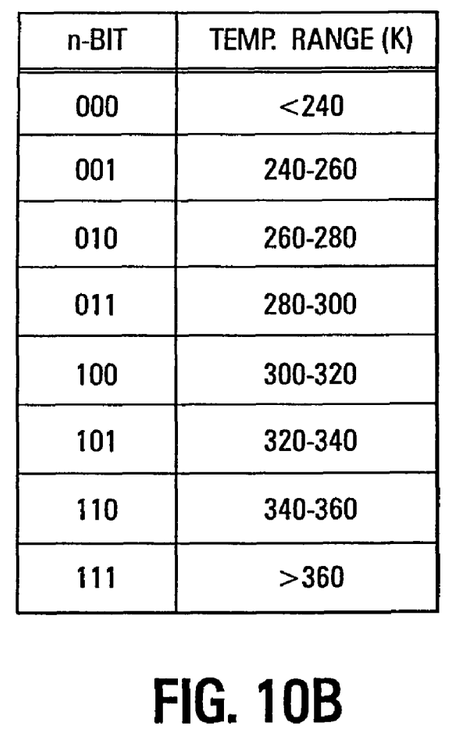

FIG. 5 illustrates a plot of $V_0(T)$ versus absolute temperature. The $2^n-1$ voltage levels are also shown. With the $2^n-1$ levels, it is possible to identify $2^n$ temperature ranges. The amplitude of each temperature range is $\Delta T=(T_{max}-T_{min})/(2^n-2)$. The quantity $S=V_0(T_{max})/T_{max}$ is the sensitivity in volts per kelvin. FIGS. 10A and 10B illustrate tables of examples of the execution of these equations.

FIG. 10A shows the case when $T_{max}=360K$, $T_{min}=240K$, n=2, and $V_0(T_{max})=1.8V$. In this embodiment, the sensitivity, S, is 5 mV/K and $\Delta T=60K$. FIG. 10B shows the case when $T_{max}=360K$, $T_{min}=240K$, and n=3. In this embodiment, $\Delta T=20K$.

During operation of the embodiments of the temperature sensing method, the integrated circuit controller reads the n-bit values illustrated in FIGS. 10A and 10B and uses a look-up table stored in memory to determine the respective temperature range.

Figure 7:
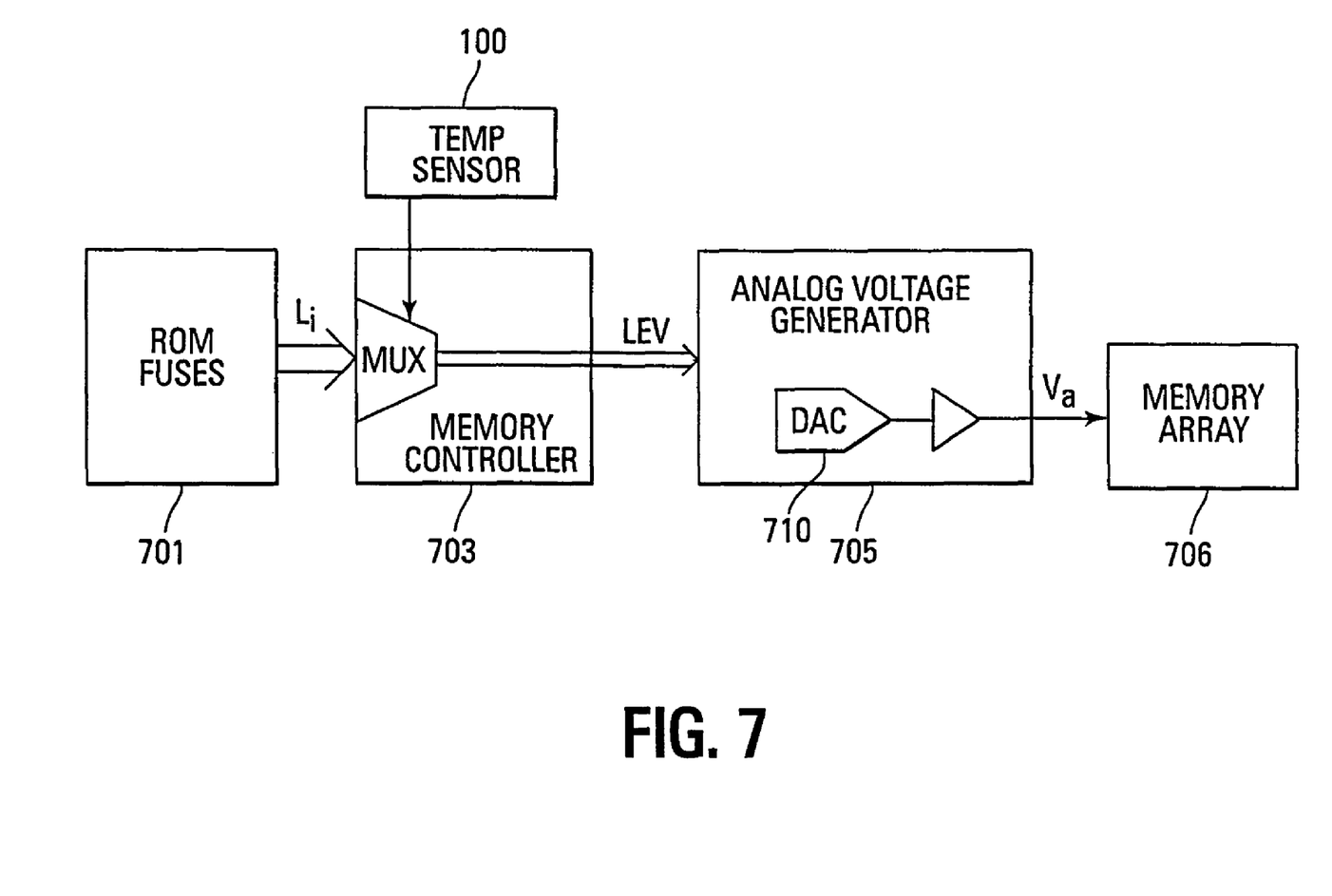
FIG. 7 shows a block diagram of one embodiment of a memory device incorporating the temperature sensing circuit of FIG. 1.

FIG. 7 illustrates one embodiment of an implementation of the temperature sensing device 100. In this embodiment, the temperature sensing device 100 is embedded in a memory device 400. Examples of such a memory device include dynamic random access memory (DRAM) and flash memory. Other embodiments can use other types of memory, volatile or non-volatile, or other types of integrated circuits requiring temperature sensing.

The embodiment of FIG. 7 includes ROM fuses 701 that store the voltage levels $L_i=L_0, L_1, \ldots L_{n-1}$. The temperature sensing circuit 100 enables the memory controller circuit 703 to select the $L_i$ value corresponding to the temperature $T_i$. The controller circuit 703 determines an operational voltage that is necessary in response to the temperature. This can be accomplished by the controller circuit 703 accessing a look-up table in memory to compare the measured absolute temperature range to an operational voltage associated with that particular temperature range.

The selected operational voltage is output as the LEV signal to the analog voltage generator 705 of the memory device. The LEV signal is a digital representation of the desired voltage necessary to compensate for the temperature of the memory device.

The analog voltage generator is comprised of a digital-to-analog converter 710 that converts the digital LEV signal to the analog operational voltage that is needed to compensate the memory array 706 operation based on the integrated circuit temperature. The compensated operational voltages can include voltage for biasing the memory cell word line, the bit line voltage, or some other operational voltage.

Figure 8:
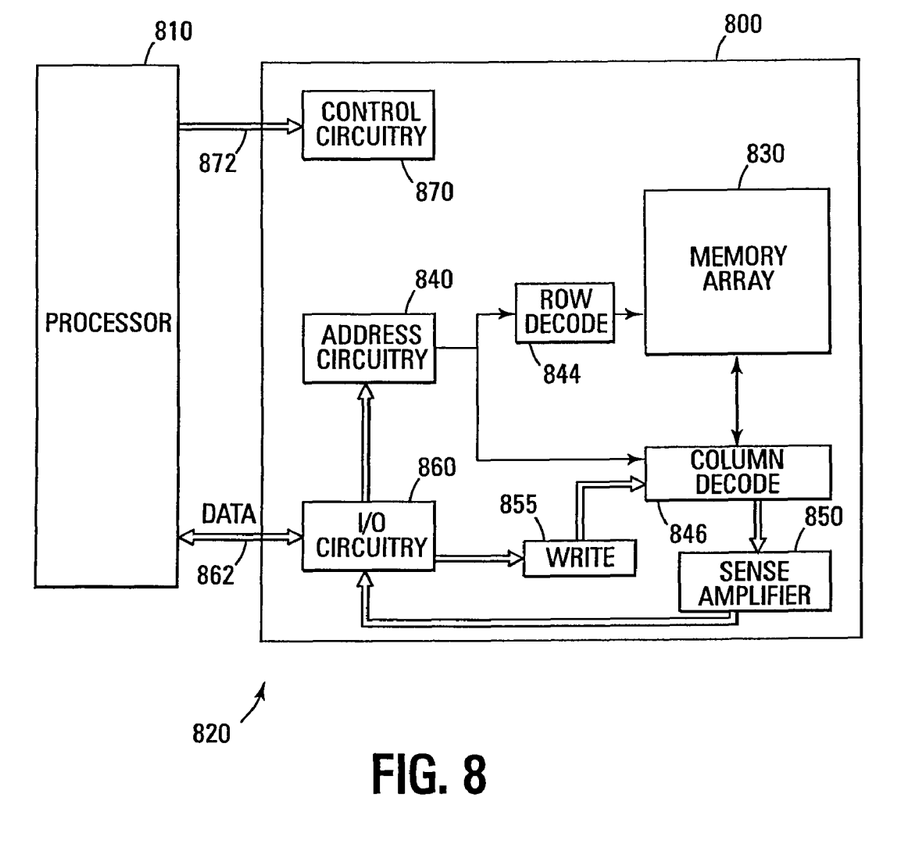
FIG. 8 shows a block diagram of one embodiment of a memory system incorporating the temperature sensing circuit of FIG. 1.

FIG. 8 illustrates a functional block diagram of a memory device 800 that can incorporate embodiments of the temperature sensing device described herein. The memory device 800 is coupled to a controller 810. The controller 810 may be a microprocessor or some other type of controlling circuitry. The memory device 800 and the controller 810 form part of a memory system 820. The memory device 800 has been simplified to focus on features of the memory that are helpful in understanding the present invention. The memory and controller can be discreet devices, separate integrated circuits, a common device or a common integrated circuit.

The memory device includes an array of memory cells 830 that, in one embodiment, are non-volatile memory cells such as flash memory cells. The memory array 830 is arranged in banks of rows and columns. The control gates of each row of memory cells is coupled with a word line while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 840 is provided to latch address signals provided over I/O connections 862 through the I/O circuitry 860. Address signals are received and decoded by row decoders 844 and column decoders 846 to access the memory array 830. It will be appreciated by those skilled in the art that, with the benefit of the present description, the number of address input connections and row/column decoders depends on the density and architecture of the memory array 830. That is, the number of addresses increases with both increased memory cell counts and increased bank and block counts.

The memory integrated circuit 800 reads data in the memory array 830 by sensing voltage or current changes in the memory array columns using sense/buffer circuitry 850. The sense/buffer circuitry, in one embodiment, is coupled to read and latch a row of data from the memory array 830. Data input and output buffer circuitry 860 is included for bi-directional data communication over the I/O connections 862 with the processor 810. Write circuitry 855 is provided to write data to the memory array.

Control circuitry 870 decodes signals provided on control connections 872 from the processor 810. These signals are used to control the operations on the memory array 830, including data read, data write, and erase operations. The control circuitry 870 may be a state machine, a sequencer, or some other type of controller. The control circuitry 870 of the present invention, in one embodiment, is responsible for executing the embodiments of the temperature measuring method.

The flash memory device illustrated in FIG. 8 has been simplified to facilitate a basic understanding of the features of the memory and is for purposes of illustration only. A more detailed understanding of internal circuitry and functions of flash memories are known to those skilled in the art. Other embodiments may include the flash memory cell of the present invention in other types of electronic systems.

Figure 9:
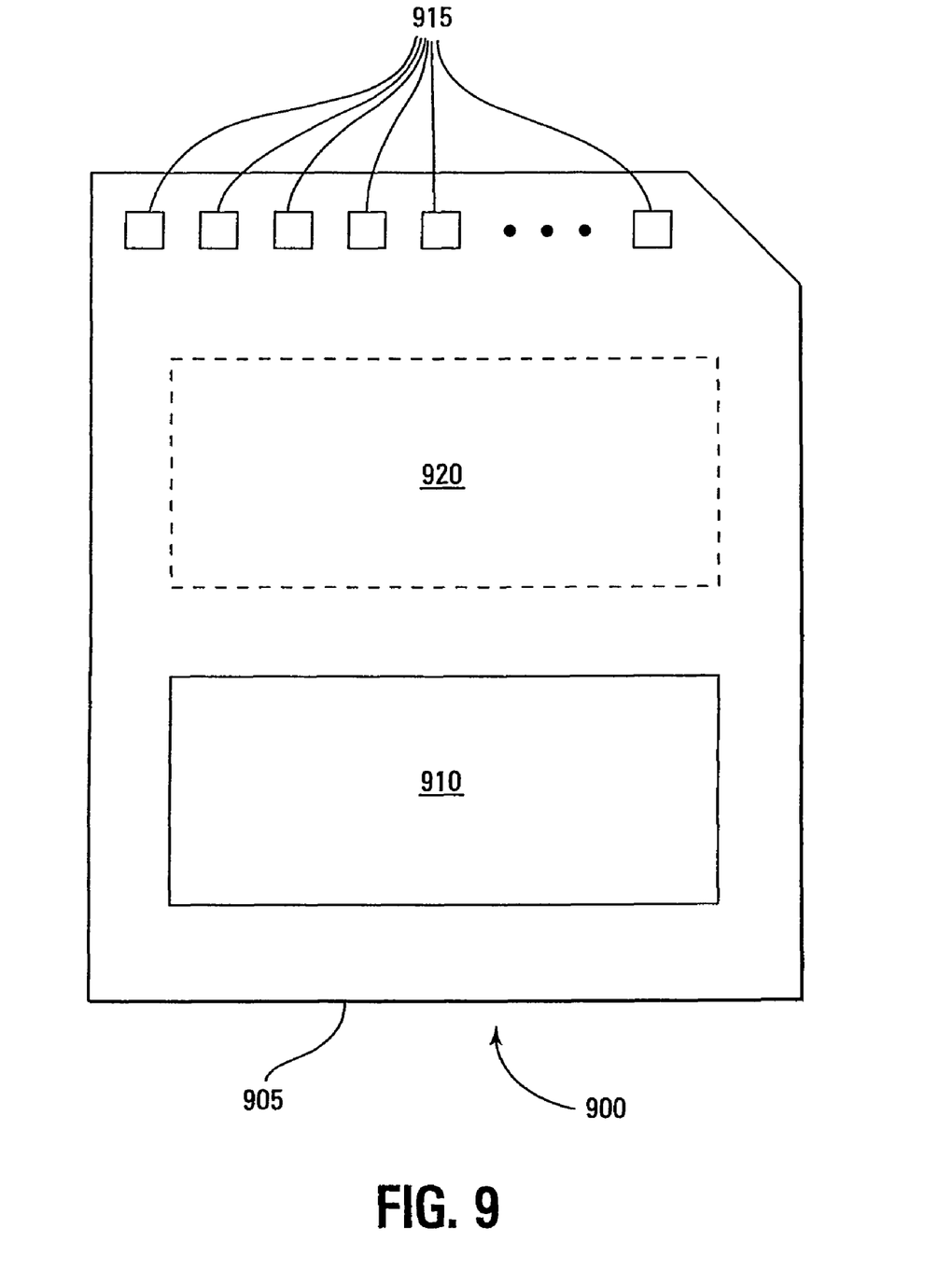
FIG. 9 shows a block diagram of one embodiment of a memory module incorporating the temperature sensing circuit of FIG. 1.

FIG. 9 is an illustration of a memory module 900 that incorporates the temperature sensing embodiments as discussed previously. Although the memory module 900 is illustrated as a memory card, the concepts discussed with reference to memory module 900 are applicable to other types of removable or portable memory, e.g., USB flash drives. In addition, although one example form factor is depicted in FIG. 9, these concepts are applicable to other form factors as well.

The memory module 900 includes a housing 905 to enclose one or more memory devices 910 of the present invention. The housing 905 includes one or more contacts 915 for communication with a host device. Examples of host devices include digital cameras, digital recording and playback devices, PDAs, personal computers, memory card readers, interface hubs and the like. For some embodiment, the contacts 915 are in the form of a standardized interface. For example, with a USB flash drive, the contacts 915 might be in the form of a USB Type-A male connector. In general, however, contacts 915 provide an interface for passing control, address and/or data signals between the memory module 900 and a host having compatible receptors for the contacts 915.

The memory module 900 may optionally include additional circuitry 920. For some embodiments, the additional circuitry 920 may include a memory controller for controlling access across multiple memory devices 910 and/or for providing a translation layer between an external host and a memory device 910. For example, there may not be a one-to-one correspondence between the number of contacts 915 and a number of I/O connections to the one or more memory devices 910. Thus, a memory controller could selectively couple an I/O connection (not shown in FIG. 9) of a memory device 910 to receive the appropriate signal at the appropriate I/O connection at the appropriate time or to provide the appropriate signal at the appropriate contact 915 at the appropriate time. Similarly, the communication protocol between a host and the memory module 900 may be different than what is required for access of a memory device 910. A memory controller could then translate the command sequences received from a host into the appropriate command sequences to achieve the desired access to the memory device 910. Such translation may further include changes in signal voltage levels in addition to command sequences.

The additional circuitry 920 may further include functionality unrelated to control of a memory device 910. The additional circuitry 920 may include circuitry to restrict read or write access to the memory module 900, such as password protection, biometrics or the like. The additional circuitry 920 may include circuitry to indicate a status of the memory module 900. For example, the additional circuitry 920 may include functionality to determine whether power is being supplied to the memory module 900 and whether the memory module 900 is currently being accessed, and to display an indication of its status, such as a solid light while powered and a flashing light while being accessed. The additional circuitry 920 may further include passive devices, such as decoupling capacitors to help regulate power requirements within the memory module 900.

CONCLUSION

The embodiments of the present invention provide a temperature sensing circuit that can be embedded in an integrated circuit such as a memory device. The temperature sensing device generates an n-bit value that is an indication of the temperature of the memory device or other integrated circuit. This value can be read by a controller circuit to provide a temperature or temperature range indicative of the n-bit value.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A temperature sensing circuit comprising:
a voltage generator circuit configured to generate a voltage that is temperature invariant and a temperature variant value;
a temperature sensing circuit coupled to the voltage generator circuit and configured to generate an output signal that is dependent on temperature;
a voltage divider circuit coupled to the voltage generator circuit and configured to generate a plurality of voltages from the output signal; and
a comparison circuit coupled to the voltage divider circuit and the temperature sensing circuit and configured to generate a temperature indication in response to the temperature variant value and the plurality of voltages.

2. The circuit of claim 1 and further including a buffer function that couples the voltage generator circuit to the voltage divider circuit.

3. The circuit of claim 1 wherein the comparison circuit is one of a flash analog-to-digital converter, a linear ramp analog-to-digital converter, or a successive approximation analog-to-digital converter.

4. The circuit of claim 3 wherein the flash analog-to-digital converter comprises a plurality of comparators having outputs coupled to a decoder that provides a binary output.

5. The circuit of claim 3 wherein the linear ramp analog-to-digital converter includes a comparator coupled to an n-bit counter that provides the temperature indication.

6. The circuit of claim 3 wherein the successive approximation analog-to-digital converter includes a comparator coupled to an n-bit successive approximation register.

7. The circuit of claim 1 wherein the output signal is linearly dependent on temperature.

8. A non-volatile memory device comprising:
a memory array that operates in response to an operational voltage;
a read only memory configured to store a plurality of representations of operational voltages;

a temperature sensing circuit configured to generate a temperature indication of a temperature of the memory device;

a memory controller coupled to the read only memory and the temperature sensing circuit and configured to select a representation of the operational voltage in response to the temperature indication; and a voltage generating circuit coupled between the memory controller and the memory array and configured to generate the operational voltage from the representation of the operational voltage.

9. The memory device of claim 8 wherein the memory device is one of a NAND or NOR flash memory.

10. The memory device of claim 8 wherein the representation of the operational voltage is selected with a multiplexer coupled to the temperature indication.

11. The memory device of claim 8 wherein the representation of the operational voltage is a digital representation of the operational voltage.

12. The memory device of claim 11 wherein the voltage generating circuit comprises a digital-to-analog converter that converts the digital representation of the operational voltage to the operational voltage for use by the memory array.

13. The memory device of claim 8 wherein the temperature indication is linearly dependent on the temperature of the memory device.

14. The memory device of claim 8 wherein the operational voltage comprises one of a voltage for biasing a word line or a voltage for biasing a bit line.

15. The memory device of claim 8 wherein the read only memory is configured to store a look-up table having each representation of an operational voltage with an associated temperature indication.

16. A method for generating an operational voltage in an integrated circuit, the method comprising:

generating an indication of a temperature of the integrated circuit;

selecting a representation of the operational voltage, from a plurality of representations of operational voltages, in response to the indication of the temperature; and converting the representation of the operational voltage to the operational voltage.

17. The method of claim 16 wherein generating the indication of the temperature comprises:

generating a temperature invariant voltage;

generating a temperature variant physical value in response to the temperature of the integrated circuit;

generating a plurality of voltages in response to the temperature invariant voltage;

generating a temperature variant voltage in response to the physical value;

comparing the temperature variant voltage to the plurality of voltages to determine a closest voltage; and generating the indication of the temperature of the integrated circuit in response to the closest voltage.

18. The method of claim 17 wherein the indication of the temperature is an n-bit digital value.

19. The method of claim 18 wherein the plurality of voltages includes $2^n-1$ voltages.

20. The method of claim 16 wherein the representation of the operational voltage is a digital representation and converting the representation of the operational voltage comprises converting the digital representation to an analog operational voltage.

* * * * *